United States Patent
Jiang et al.

(10) Patent No.: US 11,016,392 B2
(45) Date of Patent: May 25, 2021

(54) AMIDE COMBINATIONS FOR CLEANING AND STRIPPING OF ELECTRONIC PARTS

(71) Applicant: Dow Global Technologies LLC, Midland, MI (US)

(72) Inventors: Qi Jiang, Shanghai (CN); Xin Jiang, Shanghai (CN); Hua Ren, Shanghai (CN); Eungkyu Kim, Zachary, LA (US); Jianhai Mu, Shanghai (CN); Kaoru Ohba, Tokyo (JP); William J. Harris, Freeport, TX (US)

(73) Assignee: Dow Global Technologies LLC, Midland, MI (US)

( * ) Notice: Subject to any disclaimer, the term of this patent is extended or adjusted under 35 U.S.C. 154(b) by 10 days.

(21) Appl. No.: 16/628,598

(22) PCT Filed: Jul. 6, 2017

(86) PCT No.: PCT/CN2017/091996
§ 371 (c)(1),
(2) Date: Jan. 3, 2020

(87) PCT Pub. No.: WO2019/006725
PCT Pub. Date: Jan. 10, 2019

(65) Prior Publication Data
US 2020/0150542 A1      May 14, 2020

(51) Int. Cl.
*C11D 7/50* (2006.01)
*G03F 7/42* (2006.01)
*C11D 7/32* (2006.01)

(52) U.S. Cl.
CPC ............ *G03F 7/422* (2013.01); *C11D 7/3263* (2013.01)

(58) Field of Classification Search
CPC .................................................. C11D 11/0047
USPC ....................................................... 510/175
See application file for complete search history.

(56) References Cited

U.S. PATENT DOCUMENTS

| | | | |
|---|---|---|---|
| 4,200,765 A | 4/1980 | Goetz | |
| 4,770,713 A | 9/1988 | Ward | |
| 5,907,005 A | 5/1999 | Shimizu | |
| 2003/0158058 A1* | 8/2003 | Yoon, II | G03F 7/425 510/175 |
| 2004/0029753 A1* | 2/2004 | Ikemoto | C11D 7/08 510/175 |
| 2008/0139436 A1* | 6/2008 | Reid | C11D 7/3209 510/176 |
| 2011/0287995 A1 | 11/2011 | Fujioka et al. | |
| 2013/0330927 A1* | 12/2013 | Kumagai | H01L 21/0206 438/675 |
| 2016/0053116 A1 | 2/2016 | Eguchi et al. | |
| 2016/0075826 A1 | 3/2016 | Sun et al. | |
| 2019/0211286 A1* | 7/2019 | Jiang | C11D 11/0047 |

FOREIGN PATENT DOCUMENTS

| | | |
|---|---|---|
| CN | 103809396 A | 5/2014 |
| JP | H02-131239 A | 5/1990 |
| KR | 20090121650 A | 11/2009 |
| KR | 20130070061 A | 6/2013 |
| KR | 20130131796 A | 12/2013 |
| KR | 20140044728 A | 4/2014 |
| KR | 20150000183 A | 1/2015 |
| KR | 20150028526 A | 3/2015 |
| KR | 20150087642 A | 7/2015 |

(Continued)

*Primary Examiner* — Gregory E Webb
(74) *Attorney, Agent, or Firm* — Quarles & Brady LLP

(57) ABSTRACT

A solvent consisting essentially of: (A) a first component consisting of N,N-diethylacetamide (DEAC); (B) a second component consisting of 3-methoxy-N, N-dimethyl propionamide (M3DMPA); and (C) an optional third component consisting of one or more glycol ethers or glycol ether acetates; or a solvent consisting essentially of: (1) a first component consisting of one or more acyclic amides of Formula (I): and (2) an optional second component consisting of one or more of DEAC, M3DMPA, N,N-dimethylpropionamide, one or more glycol ethers or glycol ether acetates, and one or more cyclic amides of Formulae (II-IV).

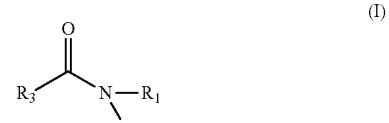

(I)

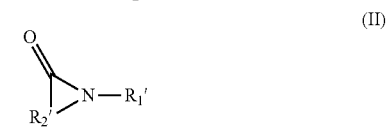

(II)

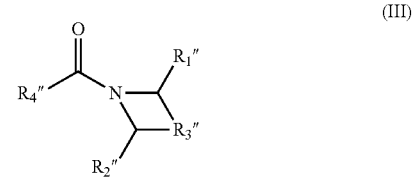

(III)

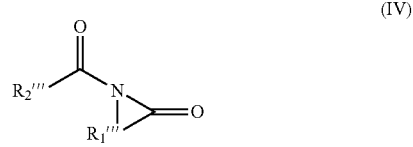

(IV)

13 Claims, No Drawings

(56) References Cited

FOREIGN PATENT DOCUMENTS

| KR | 20150122956 A | 11/2015 |
| KR | 20160030835 A | 3/2016 |
| WO | 2010/118916 A1 | 10/2010 |
| WO | 2009/005014 A1 | 11/2011 |

\* cited by examiner

AMIDE COMBINATIONS FOR CLEANING AND STRIPPING OF ELECTRONIC PARTS

FIELD

This invention relates to solvent systems for the cleaning and stripping of electronic parts.

BACKGROUND

Some polar solvents like N-methyl-2-pyrrolidone (NMP), N,N-dimethylacetamide (DMAc), N,N-dimethylformamide (DMF), etc., have reproductive toxicity, which drives the increasing safety and regulatory concerns related to these materials at global level. For example, NMP has been listed in the SVHC (Substance of Very High Concerns) in the European GHS (Globally Harmonized System of Classification and Labelling of Chemicals) and REACH Annex XVII to clarify the restrictions on the manufacture, placing on the market, and use of certain dangerous substances, mixtures and articles.

Polyimide polymers (PI) are useful in a variety of applications, including the manufacture of electronic parts such as semiconductors and display units. Poly(amic acid) (PAA) polymers are the processible, soluble precursor polymers of PI polymers. NMP and similar solvents are used in the electronics industry for cleaning electronic parts and equipment of contaminants, and stripping electronic parts of photoresist. Considerable amounts of such toxic solvents are used annually. Developing a solvent to achieve the cleaning and stripping performance of NMP but with a better environmental profile is an urgent request from the electronic parts industry.

SUMMARY

In one embodiment the invention is a solvent consisting essentially of:
(A) a first component consisting of N,N-diethylacetamide (DEAC);
(B) a second component consisting of 3-methoxy-N,N-dimethylpropionamide (M3 DMPA); and
(C) an optional third component consisting of one or more glycol ethers or glycol ether acetates.

In one embodiment the invention is a process for removing a photoresist from a substrate, the process comprising the step of contacting the photoresist with a solvent consisting essentially of:
(A) a first component consisting of DEAC;
(B) a second component consisting of M3DMPA; and
(C) an optional third component consisting of one or more glycol ethers or glycol ether acetates.

In one embodiment the invention is a solvent consisting essentially of:
(A) a first component consisting of an acyclic amide of Formula I:

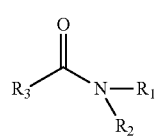

Formula I wherein
(1) each of $R_1$ and $R_2$ are independently hydrogen or C1-C4 alkyl or alkoxy groups; and
(2) $R_3$ is a C2-C7 alkyl or alkoxy group;
with the provisos that
(a) the acyclic amide of Formula I comprises 6 or more carbon atoms;
(b) $R_1$ and $R_2$ are not simultaneously hydrogen;
(c) when $R_3$ is a C3-C7 alkyl or alkoxy group, then $R_1$ and $R_2$ are a C1-C3 alkyl or alkoxy group; and
(d) when $R_3$ is a C2 alkyl or alkoxy group, then $R_1$ and $R_2$ are a C3-C4 alkyl or alkoxy group; and
(B) a second component consisting of at least one of:
(1) DEAC; or
(2) M3DMPA; or
(3) N,N-dimethylpropionamide; or
(4) one or more glycol ethers or glycol ether acetates; or
(5) one or more cyclic amides of Formulae II-IV:

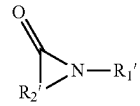

Formula II wherein $R_2'$ is a C5-C9 aliphatic group, $R_1'$ is a C1-C4 alkyl or alkoxy group, and the carbon atoms of the cyclic ring can have C1-C2 alkyl or alkoxy substituents; or

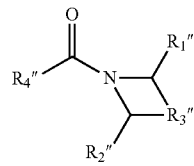

Formula III wherein $R_1''$ and $R_2''$ are hydrogen, or C1-C2 alkyl or alkoxy groups, $R_3''$ is a C2-C4 alkyl group optionally containing an ether linkage, and $R_4''$ is hydrogen or a C1-C3 alkyl or alkoxy group; or

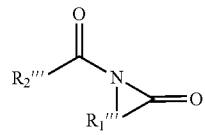

Formula IV wherein $R_1'''$ is a C5-C9 aliphatic group, $R_2'''$ is hydrogen or a C1-C3 alkyl or alkoxy group, and the carbon atoms of the cyclic ring can have C1-C2 alkyl or alkoxy substituents.

In one embodiment the solvent consists essentially of one or more acyclic amides of Formula I in combination with one or more cyclic amides of Formulae II-IV. In one embodiment the solvent system consists essentially of one or more acyclic amides of Formula I and one or more glycol ethers. In one embodiment the solvent consists essentially of one or more acyclic amides of Formula I and one or more of DEAC, M3DMPA and N,N-dimethyl propionamide.

In one embodiment the invention is a process for removing a photoresist from a substrate, the process comprising the step of contacting the photoresist with a solvent consisting essentially of:

(A) a first component consisting of an amide of Formula I:

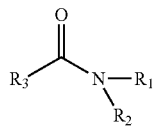

Formula I wherein
(1) each of $R_1$ and $R_2$ are independently hydrogen or C1-C4 alkyl or alkoxy groups; and
(2) $R_3$ is a C2-C7 alkyl or alkoxy group;
with the provisos that
(a) the amide of Formula I comprises 6 or more carbon atoms;
(b) $R_1$ and $R_2$ are not simultaneously hydrogen;
(c) when $R_3$ is a C3-C7 alkyl or alkoxy group, then $R_1$ and $R_2$ are a C1-C3 alkyl or alkoxy group; and
(d) when $R_3$ is a C2 alkyl or alkoxy group, then $R_1$ and $R_2$ are a C3-C4 alkyl or alkoxy group; and (B) an optional second component consisting of at least one of:
(1) DEAC; or
(2) M3DMPA; or
(3) N,N-dimethyl propionamide; or
(4) one or more glycol ethers or glycol ether acetates; or
(5) one or more cyclic amides of Formulae II-IV:

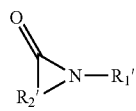

Formula II wherein $R_2'$ is a C5-C9 aliphatic group, $R_1'$ is a C1-C4 alkyl or alkoxy group, and the carbon atoms of the cyclic ring can have C1-C2 alkyl or alkoxy substituents; or

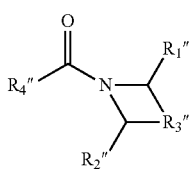

Formula III wherein $R_1''$ and $R_2''$ are hydrogen, or C1-C2 alkyl or alkoxy groups, $R_3''$ is a C2-C4 alkyl group optionally containing an ether linkage, and $R_4''$ is hydrogen or a C1-C3 alkyl or alkoxy group; or

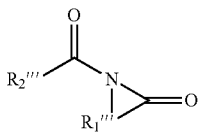

Formula IV wherein $R_1'''$ is a C5-C9 aliphatic group, $R_2'''$ is hydrogen or a C1-C3 alkyl or alkoxy group, and the carbon atoms of the cyclic ring can have C1-C2 alkyl or alkoxy substituents.

In one embodiment the solvent consists essentially of one or more acyclic amides of Formula I. In one embodiment the solvent consists essentially of one or more acyclic amides of Formula I in combination with one or more cyclic amides of Formulae II-IV. In one embodiment the solvent system consists essentially of one or more acyclic amides of Formula I and one or more glycol ethers or glycol ether acetates. In one embodiment the solvent consists essentially of one or more acyclic amides of Formula I and one or more of DEAC, M3DMPA and N,N-dimethyl propionamide.

DETAILED DESCRIPTION

Definitions

For purposes of United States patent practice, the contents of any referenced patent, patent application or publication are incorporated by reference in their entirety (or its equivalent U.S. version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1 to 7), any subrange between any two explicit values is included (e.g., 1 to 2; 2 to 6; 5 to 7; 3 to 7; 5 to 6; etc.).

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed. The term "or," unless stated otherwise, refers to the listed members individually as well as in any combination. Use of the singular includes use of the plural and vice versa.

Unless stated to the contrary, implicit from the context, or customary in the art, all parts and percents are based on weight and all test methods are current as of the filing date of this disclosure.

"Solvent" and like terms mean a substance that is capable of dissolving another substance (i.e., a solute) to form an essentially uniformly dispersed mixture (i.e., solution) at the molecular or ionic size level.

"Photoresist" and like terms mean a photosensitive resin that loses its resistance to chemical etching when exposed to radiation and is used especially in the transference of a circuit pattern to a semiconductor chip during the production of an integrated circuit.

"Electronic part" and like terms mean an in-process or finished product, or component of a product, of a manufacturing process for electronic goods, such as a semiconductor or display unit. Electronic part, as used in the context of this invention, includes the equipment used to manufacture the product.

"In-process product" and like terms mean an unfinished or intermediate product. In-process products include starting materials, e.g., materials as received from vendors, or materials before subjected to the start of the manufacturing process.

"Cleaning" and like terms mean, in the context of this invention, the removal of particulate contamination and metal ions from the surface of a substrate, usually from the surface of an in-process electronic part to ready the part for subsequent processing.

"Stripping" and like terms mean, in the context of this invention, the removal of a layer, e.g., coating or film, from the surface of a substrate, such as the removal of a photoresist from the surface of a semiconductor substrate.

Poly(amic acid) is an intermediate polymer in the synthesis of polyimide. It is soluble in polar solvents due to strong hydrogen bonding.

Polyimide (PI) is a polymer of imide monomers. It is normally produced by the reaction of a dianhydride and a diamine. One common PI used in the electronics industry is KAPTON™ polyimide. It is produced from the reaction of pyromellitic dianhydride and 4,4'-oxydiphenylamine to form the intermediate polyamic acid that is subsequently ring closed by dehydration via thermal and/or chemical means resulting in the polyimide.

Solvents

In one embodiment the solvent of this invention consists essentially of, or consists of, a first component and a second component. The first component consists essentially of, or consists of, N,N-diethylacetamide (DEAC) (CAS Number 127-19-5). The second component consists essentially of, or consists of, 3-methoxy-N,N-dimethylpropionamide (M3DMPA) (CAS Number 53185-52-7). In one embodiment the first and second components form a binary blend, and the blend is miscible. In one embodiment the binary solvent blend consists essentially of, or consists of, in weight percent (wt %) based on the weight of the binary solvent blend, from 1 to 99 wt %, or from 10 to 90 wt %, or from 20 to 80 wt %, or from 30 to 70 wt %, or from 40 to 60 wt %, of DEAC; and from 99 to 1 wt %, or from 90 to 10 wt %, or from 80 to 20 wt %, or from 70 to 30 wt %, or from 60 to 40 wt %, of the M3DMPA. In one embodiment the binary solvent blend consists essentially of, or consists of, 50 wt % of DEAC and 50 wt % M3DMPA.

In one embodiment the solvent of this invention consists essentially of, or consists of, a first component, a second component, and an optional third component. In one embodiment the first component consists essentially of, or consists of, DEAC, the second component consists essentially of, or consists of, M3DMPA, and the optional third component consists essentially of, or consists of, a glycol ether or a glycol ether acetate. The glycol ethers or glycol ether acetates are compounds based on an alkyl ether of ethylene glycol or propylene glycol. Representative glycol ethers include, but are not limited to, ethylene glycol monobutyl ether, ethylene glycol monopropyl ether, diethylene glycol monoethyl ether, propylene glycol monomethyl ether, dipropylene glycol monomethyl ether, and tripropylene glycol monomethyl ether. Representative glycol ether acetates include, but are not limited to, ethylene glycol monobutyl ether acetate, diethylene glycol monobutyl ether acetate, propylene glycol monomethyl ether acetate, dipropylene glycol monomethyl ether acetate. The optional third component can consist of one or more glycol ethers or glycol ether acetates. In one embodiment the optional third component consists of one glycol ether or one glycol ether acetate. In one embodiment the optional third component consists of two or more glycol ethers or glycol ether acetates. In one embodiment the optional third component is an ethylene glycol alkyl ether or ethylene glycol alkyl ether acetate. In one embodiment the optional third component is a propylene glycol alkyl ether or propylene glycol alkyl ether acetate. In one embodiment the alkyl component of the ethylene or propylene glycol ether is an alkyl group of 2 to 12, or 3 to 10, or 3 to 8, carbon atoms. In one embodiment the optional third component consists essentially of, or consists of, ethylene glycol monobutyl ether (CAS Number 111-76-2). In one embodiment the first component is DEAC, the second component is M3DMPA, and the optional third component is one or more glycol ethers or glycol ether acetates (e.g., one or more of ethylene glycol butyl ether, ethylene glycol butyl ether acetate, diethylene glycol ethyl ether, diethylene glycol butyl ether, ethylene glycol monobutyl ether acetate, diethylene glycol monobutyl ether acetate, propylene glycol monomethyl ether acetate, and dipropylene glycol monomethyl ether acetate) present in an amount of greater than zero (>0) to ≤20 wt %, or >0 to 15 wt %, or >0 to 10 wt %, based on the total weight of the first, second and third components of the solvent.

In one embodiment the solvent consists essentially of, or consists of, a first component consisting essentially of, or consisting of, an acyclic amide of Formula I, and a second component consisting essentially of, or consisting of, at least one of DEAC, M3DMPA, N,N-dimethylpropionamide, one or more glycol ethers, and one or more cyclic amides of Formulae II-IV. Each of the $R_1$, $R_2$ and $R_3$ alkyl or alkoxy groups of Formula I can be independently straight or branched chain. The total number of carbon atoms in Formula I is at least 6, or 7, or 8, or 9, or 10. Representative examples of acyclic amides of Formula I include, but are not limited to, N,N-dimethyl isobutyramide (CAS Number 21678-37-5), 3-butoxy-N-methyl propionamide (CAS Number 845544-42-5), 2-methoxy-N,N-dimethyl propanamide (CAS Number 90233-46-8) and N,N-dibutylacetamide (CAS Number 1563-90-2).

In one embodiment the solvent is a binary blend consisting essentially of, or consisting of, a first component consisting essentially of, or consisting of, an acyclic amide of Formula I and a second component consisting essentially of, or consisting of, DEAC.

In one embodiment the solvent is a binary blend consisting essentially of, or consisting of, a first component consisting essentially of, or consisting of, an acyclic amide of Formula I and a second component consisting essentially of, or consisting of, M3DMPA.

In one embodiment the solvent is a binary blend consisting essentially of, or consisting of, a first component consisting essentially of, or consisting of, an acyclic amide of Formula I and a second component consisting essentially of, or consisting of, N,N-dimethylpropionamide.

In one embodiment the solvent is a binary blend consisting essentially of, or consisting of, a first component consisting essentially of, or consisting of, an acyclic amide of Formula I and a second component consisting essentially of, or consisting of, one or more glycol ethers. In one embodiment the second component consists essentially of, or consists of, a single glycol ether or glycol ether acetate. In one embodiment the second component consists essentially of, or consists of, two or more glycol ethers or glycol ether acetates. The glycol ethers or glycol ether acetates that can be used as the second component of a solvent in which the first component is an acyclic amide of Formula I are the same as the glycol ethers or glycol ether acetates described above as the optional third component of a solvent in which the first component is DEAC and the second component is M3DMPA.

In one embodiment the solvent is a binary blend consisting essentially of, or consisting of, a first component consisting essentially of, or consisting of, an acyclic amide of Formula I and a second component consisting essentially of, or consisting of, at least one of a cyclic amide of Formulae II-IV. Each of the $R_1'$ alkyl or alkoxy groups and the $R_2$ aliphatic group of Formula II, and each of the $R_3''$ alkyl and the $R_4''$ alkyl or alkoxy groups of Formula III, and each of the $R_1'''$ aliphatic group and the $R_2'''$ alkyl or alkoxy group of Formula IV, are independently straight or branched chain. Representative examples of cyclic amides of Formulae II-IV include, but are not limited to, N-ethyl-ε-caprolactam (Formula II), N-acetylmorpholine (Formula III), and N-propionyl-ε-caprolactam (Formula IV).

In one embodiment the solvent is a binary blend consisting essentially of, or consisting of, in weight percent (wt %) based on the weight of the binary solvent blend, from >0 to less than (<) 100 wt %, or from 10 to 90 wt %, or from 20 to 80 wt %, or from 30 to 70 wt %, or from 40 to 60 wt %, of an acyclic amide of Formula I; and from <100 to >0 wt %, or from 90 to 10 wt %, or from 80 to 20 wt %, or from 70 to 30 wt %, or from 60 to 40 wt %, of DEAC. In one embodiment the binary solvent blend consists essentially of, or consists of, 50 wt % of an acyclic amide of Formula I and 50 wt % DEAC.

In one embodiment the solvent is a binary blend consisting essentially of, or consisting of, in weight percent (wt %) based on the weight of the binary solvent blend, from >0 to less than (<) 100 wt %, or from 10 to 90 wt %, or from 20 to 80 wt %, or from 30 to 70 wt %, or from 40 to 60 wt %, of an acyclic amide of Formula I; and from <100 to >0 wt %, or from 90 to 10 wt %, or from 80 to 20 wt %, or from 70 to 30 wt %, or from 60 to 40 wt %, of M3DMPA. In one embodiment the binary solvent blend consists essentially of, or consists of, 50 wt % of an acyclic amide of Formula I and 50 wt % M3DMPA.

In one embodiment the solvent is a binary blend consisting essentially of, or consisting of, in weight percent (wt %) based on the weight of the binary solvent blend, from >0 to less than (<) 100 wt %, or from 10 to 90 wt %, or from 20 to 80 wt %, or from 30 to 70 wt %, or from 40 to 60 wt %, of an acyclic amide of Formula I; and from <100 to >0 wt %, or from 90 to 10 wt %, or from 80 to 20 wt %, or from 70 to 30 wt %, or from 60 to 40 wt %, of N,N-dimethylpropionamide. In one embodiment the binary solvent blend consists essentially of, or consists of, 50 wt % of an acyclic amide of Formula I and 50 wt % N,N-dimethylpropionamide.

In one embodiment the solvent is a binary blend consisting essentially of, or consisting of, in weight percent (wt %) based on the weight of the binary solvent blend, from >80 to less than (<) 100 wt %, or from 85 to <100 wt %, or from 90 to <100 wt %, of an acyclic amide of Formula I; and from <0 to equal to or less than (≤) 20 wt %, or from >0 to 15 wt %, or from >0 to 10 wt %, of one or more glycol ethers.

In one embodiment the solvent is a binary blend consisting essentially of, or consisting of, in weight percent (wt %) based on the weight of the binary solvent blend, from >0 to less than (<) 100 wt %, or from 10 to 90 wt %, or from 20 to 80 wt %, or from 30 to 70 wt %, or from 40 to 60 wt %, of an acyclic amide of Formula I; and from <100 to >0 wt %, or from 90 to 10 wt %, or from 80 to 20 wt %, or from 70 to 30 wt %, or from 60 to 40 wt %, of one or more cyclic amides of Formulae II-IV. In one embodiment the binary solvent blend consists essentially of, or consists of, 50 wt % of an acyclic amide of Formula I and 50 wt % of one or more cyclic amides of Formulae II-IV.

In one embodiment the solvent consists essentially of, or consists of, a first component consisting essentially of, or consisting of, an acyclic amide of Formula I, and a second component consisting essentially of, or consisting of, two, or three, or four, or five, of DEAC, M3DMPA, N,N-dimethylpropionamide, a glycol ether or glycol ether acetate, and a cyclic amide of Formulae II, III or IV. The amount of each individual compound in the second component can vary widely and to convenience.

Preparation of the Solvent

The solvents of this invention are made using known equipment and known techniques. The individual components of the solvent are commercially available, liquid at ambient conditions (23° C. and atmospheric pressure), and can simply be mixed with another using conventional mixing equipment and standard blending protocols. The components can be added to one another in any order including simultaneously.

Use of the Solvents

In one embodiment the solvents of this invention are intended as a replacement for NMP and other polar solvents used in the electronics industry. As such, they are used in the same manner as NMP and the other polar solvents in such operations as cleaning electronic parts and equipment of contaminants, e.g., PAA, and stripping substrates, e.g., electronic parts such as semiconductor wafers, of photoresists. Typically, these methods or processes include the step of contacting the part to be cleaned or the substrate to be stripped with the solvent under any of various conditions, e.g., ambient conditions, or at an elevated temperature, with or without flow or agitation, for a sufficient period of time to dissolve whatever material, e.g., a contaminant, a photoresist, etc., that is to be removed. This contacting step is then typically followed by rinse (one or more) and drying steps.

In one embodiment the invention is a process of cleaning an electronic part or equipment of a contaminant, the process comprising the step of contacting the part or equipment with any of the solvents described in the preceding embodiments. In one embodiment the invention is a process of stripping (removing) a photoresist from a substrate, e.g., an electronic part, the process comprising the step of contacting the photoresist on the substrate with any of the solvents described in the preceding embodiments.

In one embodiment the invention is a process of cleaning an electronic part or equipment of a contaminant, the process comprising the step of contacting the part or equipment with a solvent consisting essentially of, or consisting of, one or more acyclic amides of Formula I. In one embodiment the invention is a process of stripping (removing) a photoresist from a substrate, e.g., an electronic part, the process comprising the step of contacting the photoresist on the substrate with a solvent consisting essentially of, or consisting of, one or more acyclic amides of Formula I. In these embodiments in which the solvent consists essentially of, or consists of, one or more acyclic amides of Formula I, the optional second component of DEAC, M3DMPA, etc., is absent.

The following examples are nonlimiting illustrations of the invention.

EXAMPLES

Materials

Polyamic acid, precursor of polyimide: poly (pyromellitic dianhydride-co-4,4'-oxydianiline), amic acid (from Sigma-Aldrich, 15~16 wt % dissolved in NMP).

Poly (3,3',4,4'-biphenyltetracarboxylic dianhydride-co-p-phenylenediamine), amic acid (from UBE, 20 wt. % dissolved in NMP).

Photoresist: SFP-1400 (from MERCK).

Solvents: N,N-diethylacetamide (Xinxing Chemical, 99.5%), 3-methoxy-N,N-dimethylpropionamide (Tianhua Pharmaceutical, 98%), N,N-dimethylisobutyramide (TCI, 98%) and ethylene glycol butyl ether, ethylene glycol butyl ether acetate, diethylene glycol ethyl ether, diethylene glycol butyl ether (from The Dow Chemical Company, 99%).

Solvents

The solvents are designed according to Hansen Solubility Parameter of NMP, DMF, 3-methoxy-N,N-dimethylpropanamide, etc. These commercialized solvents have strong solvency for most organic electronic materials. The solvents are described in Table 1.

TABLE 1

Solvent Blends

| Example | Component A | Weight % | Component B | Weight % | Component C | Weight % |
|---|---|---|---|---|---|---|
| 1 | N,N-diethyl acetamide | 80 | 3-methoxy-N,N-dimethyl propionamide | 20 | | |
| 2 | N,N-diethyl acetamide | 60 | 3-methoxy-N,N-dimethyl propionamide | 40 | | |
| 3 | N,N-diethyl acetamide | 40 | 3-methoxy-N,N-dimethyl propionamide | 60 | | |
| 4 | N,N-diethyl acetamide | 20 | 3-methoxy-N,N-dimethyl propionamide | 80 | | |
| 5 | N,N-diethyl acetamide | 17 | 3-methoxy-N,N-dimethyl propionamide | 68 | ethylene glycol butyl ether | 15 |
| 6 | N,N-diethyl acetamide | 17 | 3-methoxy-N,N-dimethyl propionamide | 68 | ethylene glycol butyl ether acetate | 15 |
| 7 | N,N-diethyl acetamide | 17 | 3-methoxy-N,N-dimethyl propionamide | 68 | diethylene glycol ethyl ether | 15 |
| 8 | N,N-diethyl acetamide | 17 | 3-methoxy-N,N-dimethyl propionamide | 68 | diethylene glycol bthyl ether | 15 |
| 9 | N,N-diethyl acetamide | 68 | 3-methoxy-N,N-dimethyl propionamide | 17 | ethylene glycol butyl ether acetate | 15 |
| 10 | N,N-dimethyl isobutyramide | 100 | | | | |
| 11 | N,N-dimethyl isobutyramide | 80 | N,N-dimethyl propionamide | 20 | | |
| 12 | N,N-dimethyl isobutyramide | 80 | N,N-diethyl acetamide | 20 | | |

| Comparative Example | Component A | Weight % | Component B | Weight % | Component C | Weight % |
|---|---|---|---|---|---|---|
| 1 | N-methyl-2-pyrrolidone | 100 | | | | |
| 2 | γ-butyrolactone | 100 | | | | |
| 3 | ethyl lactate | 100 | | | | |
| 4 | monoethanolamine | 15 | diethylene glycol butyl ether | 20 | DI water | 65 |
| 5 | monoethanolamine | 30 | diethylene glycol butyl ether | 70 | | |
| 6 | monoethanolamine | 10 | N-methyl-2-pyrrolidone | 70 | DI water | 20 |

Experimental Procedures

Polyamic acid dissolution:

Deionized water (DI) water is used to precipitate poly (pyromellitic dianhydride-co-4,4'-oxydianiline), amic acid, poly (3,3',4,4'-biphenyltetracarboxylic dianhydride-co-p-phenylenediamine), amic acid and poly (3,3',4,4'-biphenyltetracarboxylic dianhydride-co-4,4'-oxydianiline), amic acid solutions out of NMP solvent. The polyamic acid precursor is dried at 21° C. for 24 hours to evaporate water and trace solvent before dissolution. Examples are prepared from 30 wt % polyamic acid precursor and 70 wt % solvents. The dissolution is checked for consequence of poly (pyromellitic dianhydride-co-4,4'-oxydianiline), amic acid after 4 hours kept at 21° C. condition and consequence of poly (3,3',4,4'-biphenyltetracarboxylic dianhydride-co-p-phenylenediamine), amic acid and poly (3,3',4,4'-biphenyltetracarboxylic dianhydride-co-4,4'-oxydianiline), amic acid after 2 hours kept at 21° C. condition.

Photoresist Stripping:

Apply 2 milliliter (mL) SFP-1400 photoresist solution onto the surface of a glass substrate of the size 100 millimeters (mm)×100 mm×1 mm. The substrate is then spun with a rotational speed of 500 revolutions per minute (rpm) for 10 seconds (s) to spread out photoresist solution. Then accelerate rotation speed to 1000 rpm for 30 s to coat the photoresist homogenously and spin off excess photoresist solution. The coated substrate is heated to evaporate solvent at 130° C. for 10 minutes. The stripping step prepares 30 grams (g) of sample solvent in the 120 mm×120 mm×120 mm silica container. The baked substrate is placed into the container with shaking at 21° C., and the count time for completely removing photoresist attached on substrate is measured.

Results

Polyamic Acid Dissolution:

The polyamic acid solubility results of each product are listed in the below Table 2. The content of polymer in each example and comparative sample is 30% by weight. The performance is judged through observing whether there is residue or completely dissolved. All amide solvent samples can completely dissolve the three types of polyamic acid, which indicates the invented combinations have equivalent performance with a comparative sample, N-methyl-2-pyrrolidone (NMP). As for the other comparative samples, γ-butyrolactone and ethyl lactate, the related solubility is comparatively lower. The polyamic acid remains as residue.

TABLE 2

Polyamic Acid (poly (pyromellitic dianhydride-co-4,4'-oxydianiline), amic acid) Solvency Performance of Solvents Example

| Component A | Weight % | Component B | Weight % | Component C | Weight % | Performance |
|---|---|---|---|---|---|---|
| N,N-diethyl acetamide | 80 | 3-methoxy-N,N-dimethyl propionamide | 20 | | | ○ |
| N,N-diethyl acetamide | 60 | 3-methoxy-N,N-dimethyl propionamide | 40 | | | ○ |
| N,N-diethyl acetamide | 40 | 3-methoxy-N,N-dimethyl propionamide | 60 | | | ○ |
| N,N-diethyl acetamide | 20 | 3-methoxy-N,N-dimethyl propionamide | 80 | | | ○ |
| N,N-diethyl acetamide | 17 | 3-methoxy-N,N-dimethyl propionamide | 68 | ethylene glycol butyl ether | 15 | ○ |
| N,N-diethyl acetamide | 17 | 3-methoxy-N,N-dimethyl propionamide | 68 | ethylene glycol butyl ether acetate | 15 | ○ |
| N,N-diethyl acetamide | 17 | 3-methoxy-N,N-dimethyl propionamide | 68 | diethylene glycol ethyl ether | 15 | ○ |
| N,N-diethyl acetamide | 17 | 3-methoxy-N,N-dimethyl propionamide | 68 | diethylene glycol bthyl ether | 15 | ○ |
| N,N-dimethyl isobutyramide | 100 | | | | | ○ |
| N,N-dimethyl isobutyramide | 80 | N,N-dimethyl propionamide | 20 | | | ○ |
| N,N-dimethyl isobutyramide | 80 | N,N-diethyl acetamide | 20 | | | ○ |

Comparative

| Component | Weight % | Performance |
|---|---|---|
| N-methyl-2-pyrrolidone | 100 | ○ |
| γ-butyrolactone | 100 | X |
| ethyl lactate | 100 | X |

○ = Completely dissolved after 4 hours dissolution time.
X = Residue remaining after 4 hours of dissolution time.

TABLE 3

Polyamic Acid (poly (3,3',4,4'-biphenyltetracarboxylic dianhydride-co-p-phenylenediamine), amic acid and Poly (3,3',4,4'-biphenyltetracarboxylic dianhydride-co-4,4'-oxydianiline), amic acid) Solvency Performance of Solvents

Example

| Component A | Weight % | Component B | Weight % | Component C | Weight % | Performance |
|---|---|---|---|---|---|---|
| N,N-diethyl acetamide | 80 | 3-methoxy-N,N-dimethyl propionamide | 20 | | | ○ |
| N,N-diethyl acetamide | 60 | 3-methoxy-N,N-dimethyl propionamide | 40 | | | ○ |
| N,N-diethyl acetamide | 40 | 3-methoxy-N,N-dimethyl propionamide | 60 | | | ○ |
| N,N-diethyl acetamide | 20 | 3-methoxy-N,N-dimethyl propionamide | 80 | | | ○ |
| N,N-diethyl acetamide | 68 | 3-methoxy-N,N-dimethyl propionamide | 17 | ethylene glycol butyl ether acetate | 15 | ○ |
| N,N-dimethyl isobutyramide | 100 | | | | | ○ |
| N,N-dimethyl isobutyramide | 80 | N,N-dimethyl propionamide | 20 | | | ○ |
| N,N-dimethyl isobutyramide | 80 | N,N-diethyl acetamide | 20 | | | ○ |

Comparative

| Component | Weight % | Performance |
|---|---|---|
| N-methyl-2-pyrrolidone | 100 | ○ |
| γ-butyrolactone | 100 | X |
| ethyl lactate | 100 | X |

○ = Completely dissolved after 4 hours dissolution time.
X = Residue remaining after 4 hours of dissolution time.

Photoresist Stripping:

The photoresist stripping results of each combination are listed in Table 4. The performance is evaluated by stripping time. The amide solvent samples can completely strip the coated photoresist from glass substrate within 30 seconds. Water based monoethanolamine/diethylene glycol butyl ether and monoethanolamine/N-methyl-2-pyrrolidone comparative samples Dongjin (KR1403516B1) perform within 30 seconds for stripping as well. However the other commercial combination, monoethanolamine/diethylene glycol butyl ether without water content shows relatively slow stripping speed. Therefore, the samples exhibit relatively good stripping performance on SFP-1400 photoresist.

TABLE 4

Photoresist (SFP-1400) Stripping Performance of Solvents

Example

| Component A | Weight % | Component B | Weight % | Component C | Weight % | Performance |
|---|---|---|---|---|---|---|
| N,N-diethyl acetamide | 80 | 3-methoxy-N,N-dimethyl propionamide | 20 | | | ○ |
| N,N-diethyl acetamide | 60 | 3-methoxy-N,N-dimethyl propionamide | 40 | | | ○ |
| N,N-diethyl acetamide | 40 | 3-m ethoxy-N,N-dimethyl propionamide | 60 | | | Δ |
| N,N-diethyl acetamide | 20 | 3-methoxy-N,N-dimethyl propionamide | 80 | | | Δ |
| N,N-diethyl acetamide | 68 | 3-methoxy-N,N-dimethyl propionamide | 17 | ethylene glycol butyl ether acetate | 15 | ○ |
| N,N-dimethyl isobutyramide | 100 | | | | | ○ |

TABLE 4-continued

Photoresist (SFP-1400) Stripping Performance of Solvents

| Component A | Weight % | Component B | Weight % | Component C | Weight % | Performance |
|---|---|---|---|---|---|---|
| N,N-dimethyl isobutyramide | 80 | N,N-dimethyl propionamide | 20 | | | ○ |
| N,N-dimethyl isobutyramide | 80 | N,N-diethyl acetamide | 20 | | | ○ |

Comparative

| Component A | Weight % | Component B | Weight % | Component C | Weight % | Performance |
|---|---|---|---|---|---|---|
| monoethanolamine | 15 | diethylene glycol butyl ether | 20 | DI water | 65 | Δ |
| monoethanolamine | 30 | diethylene glycol butyl ether | 70 | | | X |
| monoethanolamine | 10 | N-methyl-2-pyrrolidone | 70 | DI water | 20 | ○ |

○ <25 seconds
Δ = 25-30 seconds
X = >30 seconds

What is claimed is:

1. A solvent consisting essentially of:
   (A) a first component consisting of N,N-diethylacetamide (DEAC);
   (B) a second component consisting of 3-methoxy-N,N-dimethylpropionamide (M3DMPA); and
   (C) an optional third component consisting of one or more glycol ethers or glycol ether acetates.

2. The solvent of claim 1 in which the optional third component is absent.

3. The solvent of claim 1 in which the optional third component is present.

4. The solvent of claim 3 in which the optional third component is present in an amount of >0 to ≤20 wt % based on the total weight of the first, second and third components of the solvent.

5. The solvent of claim 4 in which the optional third component is one or more of an alkyl ether or alkyl ether acetate of ethylene glycol or propylene glycol.

6. A solvent consisting essentially of:
   (A) a first component consisting of an acyclic amide of Formula I:

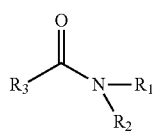

Formula I wherein
   (1) each of $R_1$ and $R_2$ are independently hydrogen or C1-C4 alkyl or alkoxy groups; and
   (2) $R_3$ is a C2-C7 alkyl or alkoxy group;
   with the provisos that
   (a) the acyclic amide of Formula I comprises 6 or more carbon atoms;
   (b) $R_1$ and $R_2$ are not simultaneously hydrogen;
   (c) when $R_3$ is a C3-C7 alkyl or alkoxy group, then $R_1$ and $R_2$ are a C1-C3 alkyl or alkoxy group; and
   (d) when $R_3$ is a C2 alkyl or alkoxy group, then $R_1$ and $R_2$ are a C3-C4 alkyl or alkoxy group; and (B) a second component consisting of at least one of:
   (1) DEAC; or
   (2) M3DMPA; or
   (3) N,N-dimethyl propionamide; or
   (4) one or more glycol ethers or glycol ether acetates; or
   (5) one or more cyclic amides of Formulae II-IV:

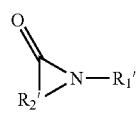

Formula II wherein $R_2'$ is a C5-C9 aliphatic group, $R_1'$ is a C1-C4 alkyl or alkoxy group, and the carbon atoms of the cyclic ring can have C1-C2 alkyl or alkoxy substituents; or

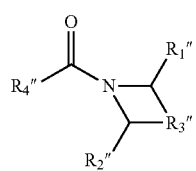

Formula III wherein $R_1''$ and $R_2''$ are hydrogen, or C1-C2 alkyl or alkoxy groups, $R_3''$ is a C2-C4 alkyl group optionally containing an ether linkage, and $R_4''$ is hydrogen or a C1-C3 alkyl or alkoxy group; or

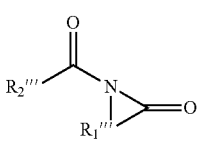

Formula IV wherein $R_1'''$ is a C5-C9 aliphatic group, $R_2'''$ is hydrogen or a C1-C3 alkyl or alkoxy group, and the carbon atoms of the cyclic ring can have C1-C2 alkyl or alkoxy substituents.

7. The solvent of claim 6 consisting essentially of one or more acyclic amides of Formula I and one or more cyclic amides of Formulae II-IV.

8. The solvent of claim 6 consisting essentially of one or more acyclic amides of Formula I and one or more glycol ethers or glycol ether acetates.

9. The solvent of claim 6 consisting essentially of one or more acyclic amides of Formula I and one or more of DEAC, M3DMPA and N,N-dimethyl-propionamide.

10. A process for stripping a photoresist from a substrate, the process comprising the step of contacting the photoresist with a solvent of claim 6.

11. A process for cleaning an electronic part or equipment of a contaminant, the process comprising the step of contacting the contaminant on the electronic part or equipment with a solvent of claim 6.

12. A process for stripping a photoresist from a substrate, the process comprising the step of contacting the photoresist with a solvent consisting essentially of one or more acyclic amides of claim 6.

13. A process for cleaning an electronic part or equipment of a contaminant, the process comprising the step of contacting the contaminant on the electronic part or equipment with a solvent consisting essentially of one or more acyclic amides of claim 6.

* * * * *